(12) United States Patent
Klein et al.

(10) Patent No.: US 8,772,818 B2
(45) Date of Patent: Jul. 8, 2014

(54) RADIATION-EMITTING DEVICE AND METHOD FOR PRODUCING A RADIATION-EMITTING DEVICE

(75) Inventors: Markus Klein, Tegernheim (DE); Tilman Schlenker, Nittendorf (DE); Andrew Ingle, Allershausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 215 days.

(21) Appl. No.: 13/055,901

(22) PCT Filed: Jul. 21, 2009

(86) PCT No.: PCT/DE2009/001022
§ 371 (c)(1),
(2), (4) Date: Apr. 21, 2011

(87) PCT Pub. No.: WO2010/009716
PCT Pub. Date: Jan. 28, 2010

(65) Prior Publication Data
US 2011/0260201 A1    Oct. 27, 2011

(30) Foreign Application Priority Data

Jul. 25, 2008  (DE) .......................... 10 2008 034 717
Oct. 27, 2008  (DE) .......................... 10 2008 053 326

(51) Int. Cl.
*H01L 33/62* (2010.01)
*H01L 33/48* (2010.01)

(52) U.S. Cl.
CPC .............. H01L 33/62 (2013.01); *H01L 33/486* (2013.01)
USPC ....................... 257/99; 257/699; 257/E33.058

(58) Field of Classification Search
CPC .............................. H01I 33/62; H01I 33/486
USPC .................................... 257/99, 699, E33.058
See application file for complete search history.

(56) References Cited

U.S. PATENT DOCUMENTS 7,074,501 B2 *  7/2006  Czeremuszkin et al. ..... 428/690
2001/0050532 A1 * 12/2001  Eida et al. ................... 313/504

(Continued)

FOREIGN PATENT DOCUMENTS

CN    1681360    10/2005
CN    1895003    1/2007

(Continued)

OTHER PUBLICATIONS

X.T. Hao et al.: "Top emitting polly(p-phenylene vinylene) light-emitting diodes on metal sandwiched polyethylene terephtalate substrates", Applied Physics B., vol. 83, Jan. 18, 2006, pp. 67-74.

(Continued)

*Primary Examiner* — Dale E Page
(74) *Attorney, Agent, or Firm* — Cozen O'Connor

(57) ABSTRACT

A radiation-emitting device is provided which comprises a substrate (10), at least one organic functional layer (100) on the substrate (10) and a second electrode (80) on the at least one organic functional layer (100). The substrate (10) includes a plastics film (1) and a metal film (3), and the metal film (3) is arranged between the plastics film (1) and the at least one organic functional layer (100) and is set up as a first electrode. A method is additionally provided for producing such a device.

15 Claims, 8 Drawing Sheets

(56) References Cited

U.S. PATENT DOCUMENTS

| | | |
|---|---|---|
| 2002/0022156 A1 | 2/2002 | Bright |
| 2003/0124392 A1* | 7/2003 | Bright ............................ 428/698 |
| 2005/0029513 A1 | 2/2005 | Kawashima et al. |
| 2005/0264189 A1* | 12/2005 | Choi et al. ..................... 313/506 |
| 2006/0007520 A1 | 1/2006 | Takakuwa et al. |
| 2007/0052356 A1 | 3/2007 | Kawauchi |
| 2007/0128966 A1* | 6/2007 | Becken et al. .................. 445/25 |
| 2007/0222370 A1 | 9/2007 | Zhu et al. |
| 2010/0243997 A1 | 9/2010 | Shimoji |

FOREIGN PATENT DOCUMENTS

| | | |
|---|---|---|
| DE | 10 2004 022 004 | 12/2005 |
| DE | 10 2006 060 781 | 4/2008 |
| EP | 1 691 429 | 8/2006 |
| JP | 2004-299230 | 10/2004 |
| JP | 2006-024535 | 1/2006 |
| JP | 2007-073338 | 3/2007 |
| JP | 2008-311059 | 12/2008 |
| WO | WO 02/065204 | 8/2002 |

OTHER PUBLICATIONS

Heinrich Becker et al., "22.2: Novel Triplet Host Materials: High Performance Made Easy", SID Digest (2005), pp. 1062-1065.

* cited by examiner

RADIATION-EMITTING DEVICE AND METHOD FOR PRODUCING A RADIATION-EMITTING DEVICE

RELATED APPLICATIONS

This is a U.S. national stage of application No. PCT/DE2009/001022, filed on Jul. 21, 2009.

This patent application claims priority from German patent application DE 10 2008 034 717.5 filed Jul. 25, 2008 and German patent application DE 10 2008 053 326.2 filed Oct. 27, 2008, the disclosure contents of both of which are hereby incorporated by reference.

FIELD OF THE INVENTION

The invention relates to a radiation-emitting device and a method of producing a radiation-emitting device.

BACKGROUND OF THE INVENTION

Radiation-emitting devices, such as for example electroluminescent, organic light-emitting diodes, comprise a substrate, on which an organic layer sequence is arranged between a first and second electrode.

SUMMARY OF THE INVENTION

One object of the invention is to provide a radiation-emitting device comprising a substrate with improved characteristics. A further object of the invention is to provide a method with which such a radiation-emitting device may be produced.

According to one embodiment, a radiation-emitting device is provided which comprises a substrate, at least one organic functional layer on the substrate and a second electrode on the at least one organic functional layer. In this case the substrate includes a plastics film and a metal film, and the metal film is arranged between the plastics film and the at least one organic functional layer and is set up as a first electrode.

In this way, a radiation-emitting device, for example a flexible, organic light emitting diode (OLEO), may be provided which comprises a substrate which is convenient to produce and which protects the layer arranged on the substrate from oxygen and moisture.

The substrate may additionally be free of barrier layers. Furthermore, the substrate may be of a flexible nature and comprise a flexible, non-rigid plastics film. Provision of the plastics film is associated with low costs, and in addition plastics films may exhibit low surface roughness. Furthermore, by using substrates which comprise plastics films on which a metal film is arranged, it is possible to dispense with sealing the plastics film off against the diffusion of oxygen or moisture for example by means of a barrier layer, since a metal film is arranged thereon. Said film may be hermetically and intrinsically impermeable to diffusion and thus prevent diffusion of oxygen or water (in the form of moisture) through the substrate. A low priced substrate which is at the same time impermeable to diffusion is thus provided for a for example flexible radiation-emitting device, which is additionally roll-to-roll capable in the case of flexible configuration. "Roll-to-roll capable" should be understood to mean that the substrate is configured in such a way that it may be unrolled from one roll, printed with further layers and rolled up again.

The metal film may in this case be vapour-deposited or sputtered on the plastics film or applied by other methods. Because the impermeable metal film is applied to the plastics film, no additional barrier layer has to be applied for preventing diffusion through the plastics film.

Furthermore, it is possible to dispense with the arrangement of an additional electrode on the substrate, since the metal film is set up as the first electrode.

"Set up" means in this context that the first metal film is contactable with an external electrical connection, and is connected electrically conductively with the organic functional layers arranged on the substrate. The metal film may here additionally comprise a structured surface, which may influence the injection of charge carriers into the at least one organic functional layer.

Furthermore, the metal film may comprise the same lateral dimensions as the plastics film. If the substrate is to be insulated in zones from the layers arranged on the substrate, the metal film may comprise gaps in these zones.

The substrate may additionally have a larger lateral dimension than the at least one organic functional layer and the second electrode. In this way, the substrate, which comprises the plastics film and the metal film, may extend beyond the active zone, i.e. beyond the area defined by the at least one organic functional layer and the second electrode. The substrate may comprise an area which extends on all sides beyond the area defined by the at least one organic functional layer and the second electrode. In this way, the substrate, comprising the plastics film and the metal film, may comprise zones which are covered by the at least one organic functional layer and on which further functional coatings, for example insulating layers or encapsulation layers may be applied.

The metal film may furthermore be impermeable to diffusion. In this context, impermeable to diffusion means hermetically and intrinsically impermeable to oxygen and water, also in the form of moisture. This means that it is no longer possible to detect diffusion of oxygen and/or water through the metal film using measuring methods available for this purpose. Thus, no measurable quantity of oxygen and/or water diffuses through the metal film for a long period, for example a number of years. The oxygen- and water-sensitive organic functional layers arranged on the substrate are thus protected from oxygen and water by the metal film, so extending their service life.

The impermeable nature of the metal film here consists not only in intrinsic impermeability over small areas, but rather it is also possible for no or only very few grain boundaries, pores and channels to be present, through which the oxygen or water could diffuse. This means inter alia that the impermeable metal film exhibits no or only very few spot effects. The occurrence of "black spots" is thus prevented and the efficiency of the device increased. In order to establish whether the metal film is impermeable to diffusion, the finished radiation-emitting device may undergo a service life test. To this end, the device is placed in a humidified oven, and exposed for 3 to 6 weeks to extremely elevated levels of oxygen and water in the form of atmospheric humidity. This accelerated measurement of diffusion through the substrate may be extrapolated to the service life of the device under normal conditions.

It is thus possible for a radiation-emitting device, which may be of flexible design, having a substrate which comprises a plastics film and an impermeable metal film, to have a service life of 8 to 12 years.

The plastics film may furthermore be less impermeable to diffusion than the metal film. Plastics films generally have poorer barrier properties than impermeable metal films, i.e. they exhibit diffusion of oxygen and water. In order to be able nevertheless to use them in the substrate in the radiation-emitting device, which may be of flexible design, it is possible to dispense with making them impermeable to diffusion to oxygen and water by a barrier layer for example, since a metal film, which is intrinsically and hermetically impermeable to diffusion, is arranged thereon. It is thus possible to save on the costs and effort involved in providing the substrate.

The plastics film may comprise a material which is selected from a group including polyester, polyethylene (PE), polypropylene (PP), polyvinyl chloride (PVC), polystyrene (PS), polyvinylidene chloride (Saran), ethylene vinyl alcohol (EVA), cellophane, cellulose, polylactide (PLA), polyamide, polyimide (PI), polycarbonates (PC), polyacrylates and mixtures thereof.

Examples of polyesters are PET (polyethylene terephthalate), Mylar (BOPET: biaxially oriented polyethylene terephthalate) or PES (polyether sulfone). A polyacrylate is for example PMMA (polymethyl methacrylate). Polyethylene may take the form of highly branched low density polyethylene (LDPE) or of slightly branched high density polyethylene (HDPE).

These materials may exhibit the property of being capable of being drawn, blown or extruded into films or processed into films by means of other methods.

Combining these materials with metal films makes it possible to avoid the problems associated with plastics films not used as a substrate without a metal film, such as for example, thermal deformation, swelling and shrinkage due to moisture absorption or mechanical deformation. As a result of the improved characteristics of the substrate comprising a plastics film and a metal film the long-term stability of the radiation-emitting device may be increased and quality losses avoided.

A planarisation layer may additionally be arranged between the plastics film and the metal film. The planarisation layer is of a thickness such as to level any surface roughnesses of the plastics film and the metal film. Since organic layers of a radiation-emitting device are typically a few tens of nm thick, the effect of surface roughness is manifested through a plurality of layers. By using a planarisation layer these effects of surface roughness through a plurality of layers may be reduced or avoided. Furthermore, the planarisation layer may contribute to an improvement in adhesion between the plastics film and the metal film.

The planarisation layer may comprise a material which is selected from a group which comprises polyimides, polyamides, polysiloxanes, epoxy resins, polyurethanes, BCBs, acrylics and other polymers with a low dielectric constant, inorganic oxides and combinations thereof. Inorganic oxides may be obtained from a sol-gel process, in which gels are produced from colloidal dispersions, and for example spin on glasses or vacuum-deposited inorganic oxides. Spin on glasses are understood to mean polysiloxanes or other siloxanes which are dissolved in a solvent, and applied as a solution and cured at high temperatures. A glassy material is then formed with an elevated $SiO_2$ content.

In addition to these planarisation materials, it is also possible to use self-assembling monolayers (SAM), which may additionally constitute electrical insulation. Self-assembling monolayers are highly ordered layers and form spontaneously on immersion of surface-active and/or organic substances in a solution. In general, the planarisation layer does not have to be impermeable to diffusion, since it is arranged between the plastics film and the impermeable metal film.

By combining a flexible plastics film, planarisation layer and metal film it is possible to provide a flexible substrate which is impermeable to diffusion and roll-to-roll capable. This substrate is additionally low priced to produce, unlike metal foils, which, if used as a substrate, require expensive manufacturing methods and exhibit considerable surface roughness.

Furthermore, the radiation-emitting device may comprise a glass encapsulation and/or a thin-film encapsulation on the second electrode and on the substrate to encapsulate the at least one organic functional layer. The thin-film encapsulation may be a thin layer which completely surrounds the organic layers. Thus, flexible encapsulation of the radiation-emitting device is provided, which prevents oxygen and/or water, also in the form of moisture, from diffusing in from all sides. The encapsulation may to this end be hermetically and intrinsically impermeable to oxygen and water and not exhibit any spot effects.

In the case of a radiation-emitting device with the above-stated characteristics the at least one organic functional layer and the second electrode are arranged on the substrate, which comprises a metal film, such that the light produced by the device is not coupled out through the substrate but rather through the second electrode. This means that the metal film may metallise the substrate and may improve the outcoupling of light through the second electrode. Such a radiation-emitting device is known as a top emitter.

The thin-film encapsulation and/or the glass encapsulation may additionally be transparent. A thin-film encapsulation may comprise an $SiO_2$ layer produced by the plasma-enhanced chemical vapour deposition (PE-CVD) method and have a thickness of 25 nm to 500 nm, for example a thickness of 100 nm. A thin-film encapsulation may additionally comprise as its material inorganic layers, such as for example $Al_2O_3$, $TiO_2$, $ZrO_2$, $SiO_2$, $Si_3N_4$, SiC or DLC (Diamond-Like Carbon) or combinations of these layers.

If the encapsulation is a glass encapsulation, the latter may comprise an amorphous glass, which is applied for example by electron beam micrometers, for example 3 μm.

A thin-film encapsulation may be combined with a glass encapsulation. To this end, a thin glass layer is laminated onto the thin-film encapsulation. Any remaining small pores in the thin-film encapsulation may be eliminated by the additional glass encapsulation. The additional glass encapsulation increases the diffusion paths for water and oxygen by orders of magnitude and thus slows down diffusion. Furthermore, the additional glass encapsulation on the thin-film encapsulation replaces additional functional coatings, for example scratch- and corrosion-resistant layers. The glass encapsulation may also be applied on the thin-film encapsulation without protective gas environment, so involving little effort.

Between the second electrode and the encapsulation or on the side of the encapsulation remote from the second electrode, additional layers may additionally be provided which for example comprise conversion phosphors or light extraction structures. The wavelength of the light emitted by the device may thus be modified and/or amplified.

The encapsulation may furthermore also be electrically insulating. In this case, a thin-film encapsulation of a plurality of layers may comprise a layer sequence of $SiN_x$, $SiO_2$, $SiN_x$ layers.

The second electrode may furthermore be transparent or semitransparent. For example, the second electrode may exhibit a transparency of more than 50%.

Electrode materials comprising high conductivity and transparency may be selected from transparent, electrically conductive oxides (transparent conductive oxides, or "TCO" for short). Thin metal films are also used, which may exhibit particularly low surface resistivity. Such metal films may exhibit thicknesses in a range of from 10 nm to 10 μm and a surface resistivity of <<5 Ω/area. Compared with this, an ITO electrode on glass has a surface resistivity of 15 Ω/area while an ITO-metal-ITO layer sequence has one of 5 Ω/area. Mixed systems, such as indium-tin oxide/metal/indium-tin oxide, may for example be provided as the material for the second electrode.

Transparent, electrically conductive oxides are transparent, electrically conductive materials, generally metal oxides, such as for example zinc oxide, tin oxide, cadmium oxide, titanium oxide, indium oxide or indium-tin oxide (ITO). In addition to binary metal-oxygen compounds, such as for example ZnO, $SnO_2$ or $In_2O_3$, ternary metal-oxygen compounds, such as for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. It may additionally be possible for the TCOs not necessarily to correspond to a stoichiometric composition and they may also be p- or n-doped.

The metal film, which is set up as the first electrode, may comprise a material comprising aluminium, copper, chromium, gold, platinum, chromium, molybdenum, silver or alloys of these metals. The metal film may additionally comprise at least sublayers which in each case comprise one of the metals aluminium, copper, chromium, gold, platinum, chromium, molybdenum, silver or alloys thereof and are arranged stacked one above the other. The metal film does not have to be transparent if the radiation-emitting device is a top emitter.

It is additionally possible to arrange a structured insulating layer between the glass encapsulation and/or thin-film encapsulation and the substrate. This is not located in the active zone of the device, i.e. on zones of the substrate which are covered by the at least one organic functional layer. The insulating layer may electrically insulate the direct contact between the metal film and the second electrode.

The insulating layer may comprise a material which is selected from $Al_2O_3$, $TiO_2$, $ZrO_2$, $SiO_2$, $Si_3N_4$, SiC, DLC or combinations thereof. The insulating layer may additionally be impermeable to diffusion and for example applied in a plasma.

The radiation-emitting device may comprise an organic light-emitting diode (OLED). The OLED, which may also be of flexible design, may emit coloured or white light. In the case of an OLED, at least one light-emitting layer is arranged between two electrodes. The electrodes inject electrons or holes into the light-emitting layer, where they recombine and thus result in light emission.

A method is additionally provided for producing a radiation-emitting device having the above-stated properties. The method comprises the following method steps
A) providing a plastics film and a metal film to produce a substrate,
B) setting up the metal film as the first electrode, and
C) arranging at least one organic functional layer on the substrate and a second electrode on the organic functional layer. The substrate may then have a larger area than the arrangement provided in method step C).

In this way, a method is provided which allows the production of a radiation-emitting device which comprises a substrate which includes a plastics film and a metal film, the metal film taking the form of the first electrode and the substrate being low priced to produce. The method likewise allows the production of a flexible radiation-emitting device which comprises a substrate which includes a flexible plastics film and a metal film, the metal film taking the form of the first electrode.

The method may additionally comprise a method step A) with the steps
A1) producing a plastics film, and
A2) arranging a metal film on the plastics film. A substrate may thus be produced which comprises a plastics film and a metal film.

Method step A1) comprises drawing, extruding or blowing a material for the plastics film. Further production methods are conceivable for producing the plastics film. A plastics film for the substrate is thus simply provided. The plastics film may also be of a flexible nature.

Furthermore, in method step A2) a material for the metal film may be vapour deposited on the plastics film. A metal film which may be of a thin, impermeable, smooth nature is thus applied to the plastics film, a substrate thus being provided which is also suitable for flexible radiation-emitting devices and prevents damage due to diffusion of oxygen or water to the organic layers arranged on the substrate.

By setting up the metal film as the first electrode, the metal film has the twin functions of being configured as an electrode and a seal for plastics film. To set up the metal film as an electrode, the metal film is connected electrically conductively to an external electrical connection and is of such a nature that an electrically conductive connection to the subsequently applied organic functional layers is produced.

In method step A2) a material for the metal film may additionally be applied by sputtering. Prior to sputtering the plastics film may be etched. Etching improves adhesion between the plastics film and the metal film and thus increases the stability of the substrate.

Furthermore, in a method step A3) between method steps A1) and A2) a planarisation layer may be arranged on the plastics film. The planarisation layer may be such that by suitable selection of its thickness it levels surface roughness exhibited by the plastics film and thus allows the arrangement of a smooth metal film on the planarisation layer. The planarisation layer may for example be of a thickness selected from the range 1 to 100 μm.

The method may furthermore comprise a method step D), following on from method step C), in which the arrangement provided in method step C) is encapsulated by a glass encapsulation and/or a thin-film encapsulation. An encapsulation may thus be applied to the substrate, which encapsulation encapsulates the at least one organic functional layer together with the metal film in a hermetically and intrinsically impermeable manner.

Method step D) may comprise the steps
D1) arranging a structured insulating layer on zones of the substrate which are not covered by the at least one organic functional layer,
D2) arranging the glass encapsulation and/or the thin-film encapsulation on the structured insulating layer and the second electrode.

The at least one organic functional layer is thus completely surrounded by the glass encapsulation and/or the thin-film encapsulation and thus protected from all sides from oxygen and/or moisture diffusion.

BRIEF DESCRIPTION OF THE DRAWINGS

The figures and exemplary embodiments are intended to explain individual exemplary embodiments of the invention in greater detail.

DETAILED DESCRIPTION OF THE DRAWINGS

The following FIGS. 1 and 3 to 7 show embodiments of flexible radiation-emitting devices. The embodiments may equally well be configured as non-flexible devices.

Figure 1:
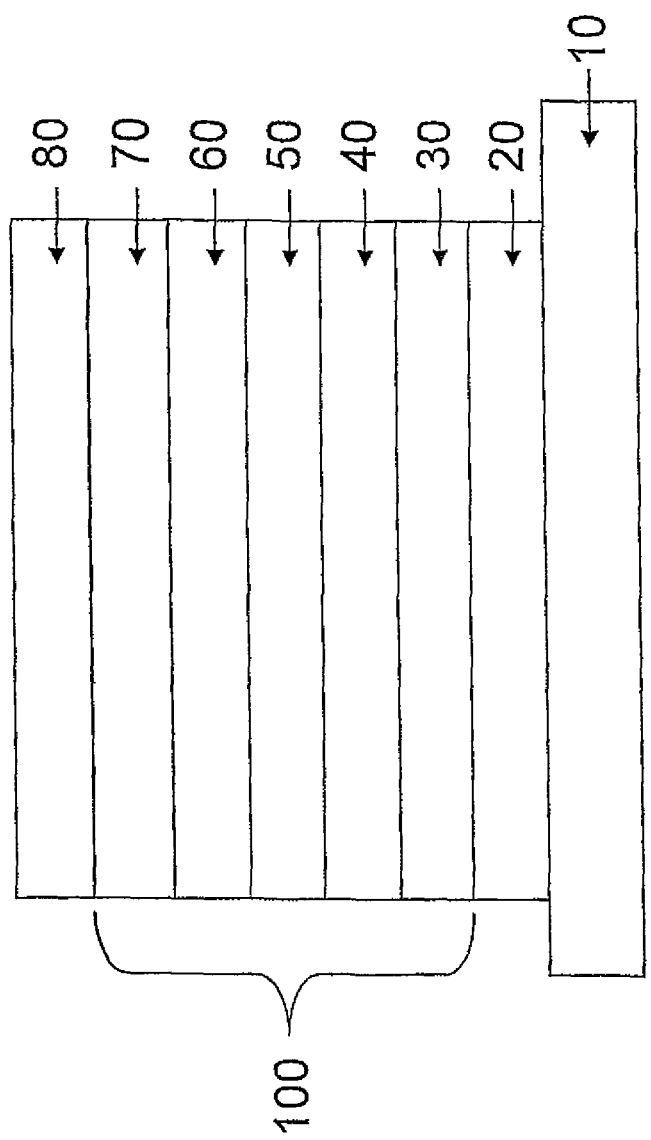
FIG. 1 shows a schematic side view of a flexible radiation-emitting device.

FIG. 1 shows a schematic side view of a flexible radiation-emitting device, which may for example be an organic light-emitting diode (OLED). This comprises a substrate 10, a first electrode 20, a charge injection layer 30, a charge transport layer 40, a first light-emitting layer 50, a second light-emitting layer 60, a third light-emitting layer 70, and a second electrode 80. The charge injection layer 30, the charge transport layer 40, and the first, second and third light-emitting layers 50, 60 and 70 together form the organic functional layers 100. The first electrode 20 may for example be an anode, while the second electrode 80 may for example be a cathode. The organic layers are arranged between anode and cathode. If the first electrode 20 is an anode, the charge injection layer 30 is a hole injection layer and the charge transport layer 40 is a hole transport layer. The first light-emitting layer 50 may for example emit blue light, the second light-emitting layer 60 may for example emit green light and the third light-emitting layer 70 may for example emit red light. Further light-emitting layers, or different sequences of colours of light emitted by the various layers are also conceivable. It is moreover possible for further organic functional layers, such as for example electron injection and electron transport layers, to be present.

A radiation-emitting device may however also comprise a simpler structure, for example a substrate 10, a first electrode 20, a light-emitting layer 50, which may emit light in any desired colour, and a second electrode 80. The other layers shown in FIG. 1 may optionally be added.

Examples of materials for these layers are indium-tin oxide (ITO) for the first electrode in the case of an anode, 1-TNATA for the charge injection layer in the case of the hole injection layer, s-TAD for the charge transport layer in the case of a hole transport layer, SEB010:SEB020 for a blue light-emitting layer, TMM004:Ir(ppy)$_3$ (15%) for a green light-emitting layer, and TMM-04:TER012 for a red light-emitting layer. For the cathode, for example the second electrode, metals, such as for example aluminium, copper, chromium or silver may be selected.

The electrons and holes injected by the electrodes into the organic functional layers recombine in the light-emitting layers, such that light is emitted. On which side of the radiation-emitting device the light is coupled out depends on whether the substrate and the first and second electrodes are of a transparent nature. If the substrate and the first electrode are of a transparent nature, the device is a bottom emitter, whereas if the second electrode and the encapsulation are of a transparent nature, the device is a top emitter. It is moreover conceivable for all of the substrate, first electrode and second electrode to be of a transparent nature and for light emission to take place via both sides of the radiation-emitting device.

Figure 2:
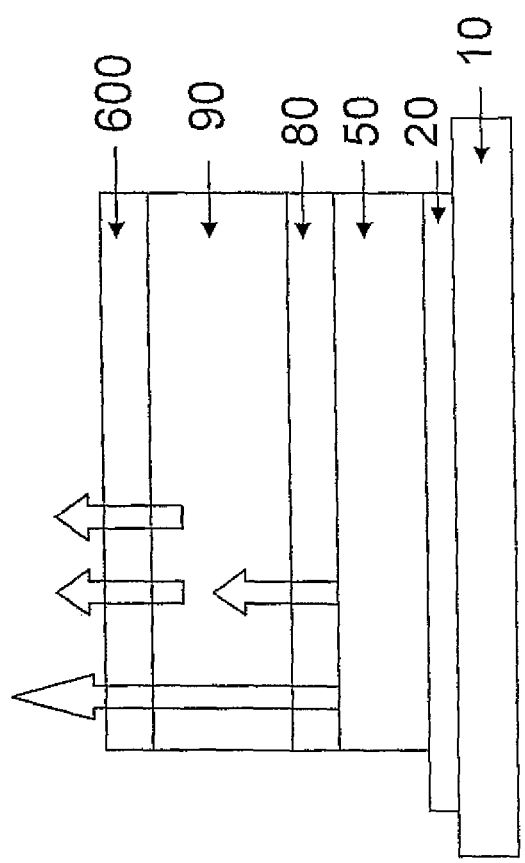
FIG. 2 shows a schematic side view of a conventional, top-emitting radiation-emitting device.

FIG. 2 shows a schematic side view of a top-emitting radiation-emitting device. This comprises a substrate 10, on which the first electrode 20 is arranged, the light-emitting layer 50 and the second electrode 80. The substrate here comprises a rigid glass and is thus not of a flexible nature. Use of this substrate makes it necessary to arrange an additional first electrode 20 on the substrate. The emitted light, which is indicated here by arrows, is coupled out of the radiation-emitting device through the second electrode, and passed through functional layers 90 and a thin-film encapsulation 600. The functional layers may for example contain radiation-converting phosphors, for varying the wavelength of the emitted light. Furthermore, functional layers may comprise scattering structures, for boosting the intensity of the light. The thin-film encapsulation 600 is in this case of a transparent nature, such that light emission is not impeded. The thin-film encapsulation additionally serves in encapsulation of the device, so that the organic layers are not damaged by oxygen or moisture. It is shown schematically on the functional layer, but may also enclose the entire radiation-emitting device.

Figure 3:
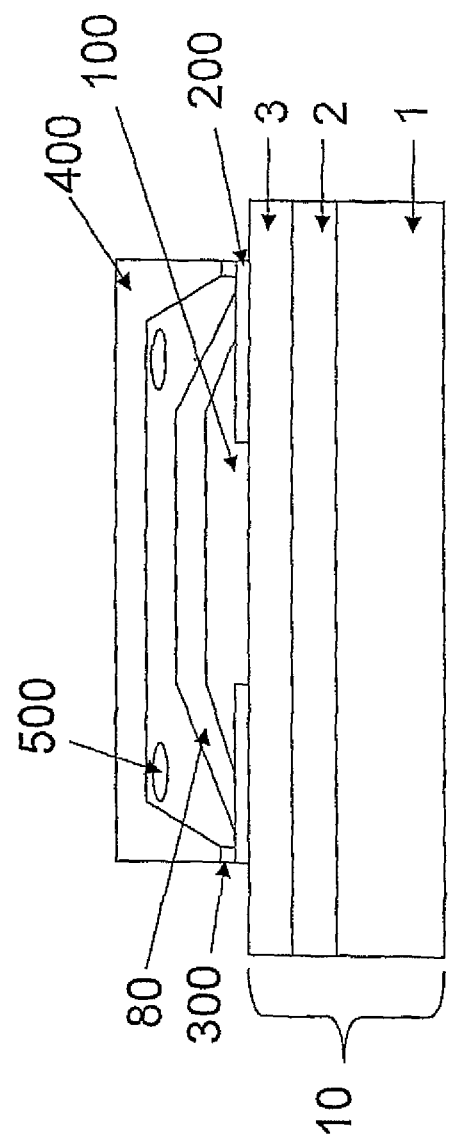
FIG. 3 shows a schematic side view of an embodiment of the flexible radiation-emitting device.

FIG. 3 shows a schematic side view of an embodiment of the flexible radiation-emitting device. This comprises a substrate 10, which includes a plastics film 1, a planarisation layer 2 and a metal film 3. The planarisation layer 2 is optional and, depending on the roughness of the plastics film 1, may be omitted. The metal film 3 is an intrinsically and hermetically impermeable metal film, which acts simultaneously as an electrode for the radiation-emitting device. It may be set up as an anode or cathode and applied with or without structuring to the plastics film or to the planarisation layer. The arrangement of an additional first electrode on the substrate is thus not necessary. The planarisation layer may furthermore also serve to improve adhesion between the metal film 3 and the plastics film 1. The substrate may seal off the organic layers from moisture and oxygen and serves at the same time as a first electrode, to which voltage may be applied to produce the emission of radiation.

The substrate 10 has a larger area than the subsequent layers, such that on all sides the area of the substrate 10 overlaps the area of the other layers. A structured insulating layer 200 is present on the substrate 10, which prevents direct contact between the metal film 3 and the second electrode 80. The insulating layer may comprise a material which is selected from $Al_2O_3$, $TiO_2$, $ZrO_2$, $SiO_2$, $Si_3N_4$, SiC, DLC or combinations thereof. The insulating layer 200 may for example be a 100 nm thick $SiO_2$ layer, which is produced using a PE-CVD method.

The organic functional layers 100 are applied in between the structured insulating layer. The second electrode 80 is located on the organic functional layers 100. By means of a coupling agent 300 a glass encapsulation 400 is applied to the organic layers and the second electrode 80 in such a way that a cavity arises between the glass encapsulation 400 and the second electrode 80. At the side edges of the cavity, outside the emitting zone of the organic functional layers, a desiccant 500 may be provided, which absorbs any moisture diffusing in through the coupling agent 300. Examples of a desiccant are zeolites or CaO, which are incorporated in Teflon. In this embodiment the coupling agent 300 is applied to the insulating layer 200. It may additionally also be applied to the metal film 3.

The coupling agent may comprise a material which is selected from a group comprising epoxides, acrylates, silicones, and varnish-like materials.

Figure 4:
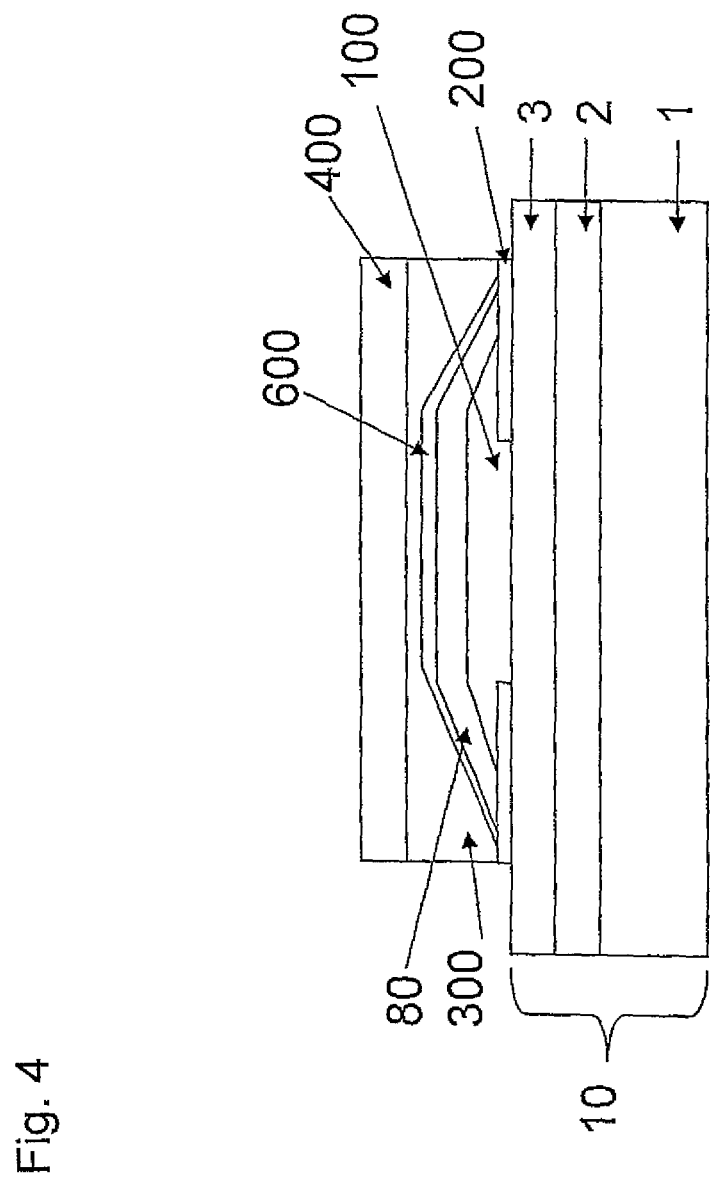
FIG. 4 shows a schematic side view of a further embodiment of the flexible radiation-emitting device.

FIG. 4 shows a schematic side view of a further embodiment of the flexible radiation-emitting device. The substrate 10, the insulating layer 200, the organic functional layers 100 and the second electrode 80 resemble the embodiment of FIG. 3. The encapsulation here comprises a thin-film encapsulation 600 and a glass encapsulation 400. These are again joined together by a coupling agent 300.

The thin-film encapsulation 600 is deposited directly onto the second electrode 80 for example by means of a plasma process. Said encapsulation here comprises a thin transparent layer, which is hermetically impermeable to water and oxygen. It may for example comprise a stack of 100 nm thick $SiN_x$, 50 nm thick $SiO_2$ and 100 nm thick $SiN_x$ layers. A glass encapsulation 400 provided with a transparent, light-resistant coupling agent is applied to this thin-film encapsulation 600 by lamination in such a way as to be free of air bubbles.

Coupling agents may comprise for example epoxides, acrylates, silicones, varnish-like materials and other adhesive materials. Curing of the coupling agent may proceed for example by exposure to light, heat or chemical reaction in two-component adhesives. Alternatively, coupling agents may also be used which are permanently tacky. The coupling agent may be 10 μm thick.

Figure 5:
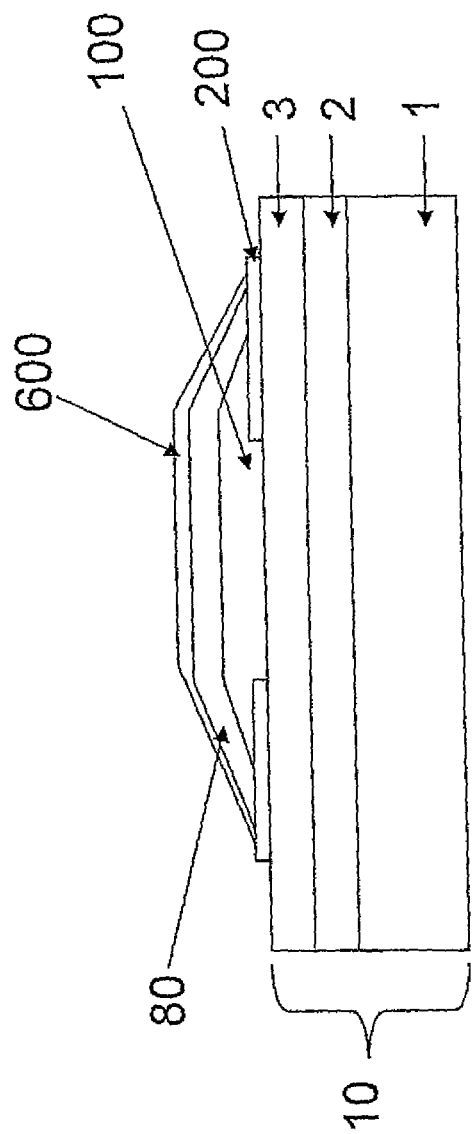
FIG. 5 shows a schematic side view of an embodiment of the flexible radiation-emitting device.

FIG. 5 shows a schematic side view of a further embodiment of the flexible radiation-emitting device. The substrate 10, the insulating layer 200, the organic functional layers 100 and the second electrode 80 resemble the embodiments in FIGS. 3 and 4. Compared with the devices of FIGS. 3 and 4, the encapsulation provided here merely comprises a thin-film encapsulation 600. This is deposited directly onto the second electrode 80 for example by a plasma process as a thin transparent layer and is hermetically impermeable to water. The thin-film encapsulation may for example comprise a layer stack of a relatively large number of $SiN_x$, $SiO_2$, $SiN_x$ layers.

In the embodiments in FIGS. 3 to 5 further functional layers may be provided (not shown here) which comprise conversion phosphors, outcoupling structures, colour filters, scratch-resistant and/or UV protection materials. These layers may be located inside or outside the encapsulation.

Figure 6:
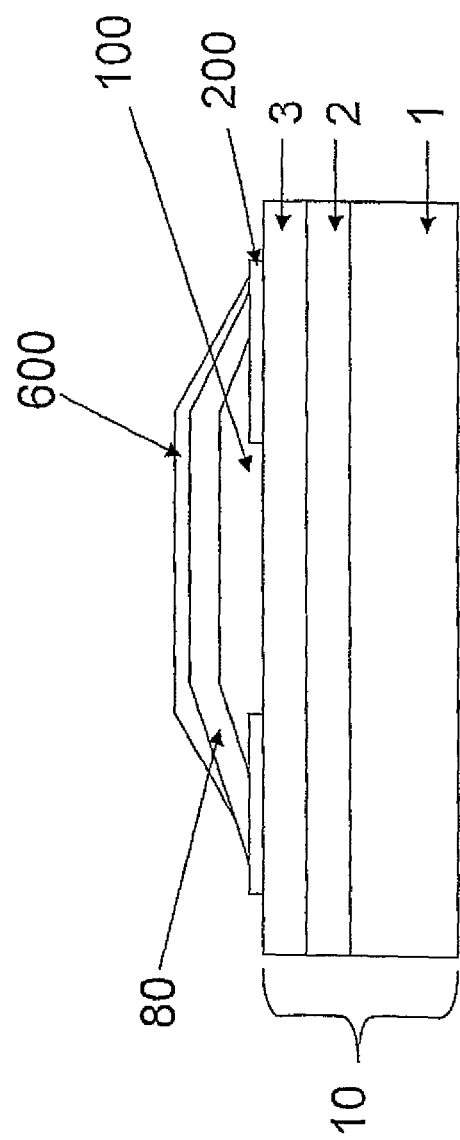
FIG. 6 shows a schematic side view of an embodiment of the flexible radiation-emitting device.

FIG. 6 shows a schematic side view of an embodiment of the flexible radiation-emitting device. FIGS. 3 to 5 in each case showed an encapsulation which completely encloses the functional layers 100 and the second electrode 80. In FIG. 6 the second electrode 80 is shown protruding out of the encapsulation, in this case a thin-film encapsulation 600, so as to be capable of electrical connection from outside. To this end the second electrode has to be applied to the insulating layer 200, in order to prevent a short-circuit with the metal foil 3.

The outward-protruding second electrode 80 is also present in the embodiments according to FIGS. 3 to 5, but is not shown therein for clarity's sake.

Figure 7:
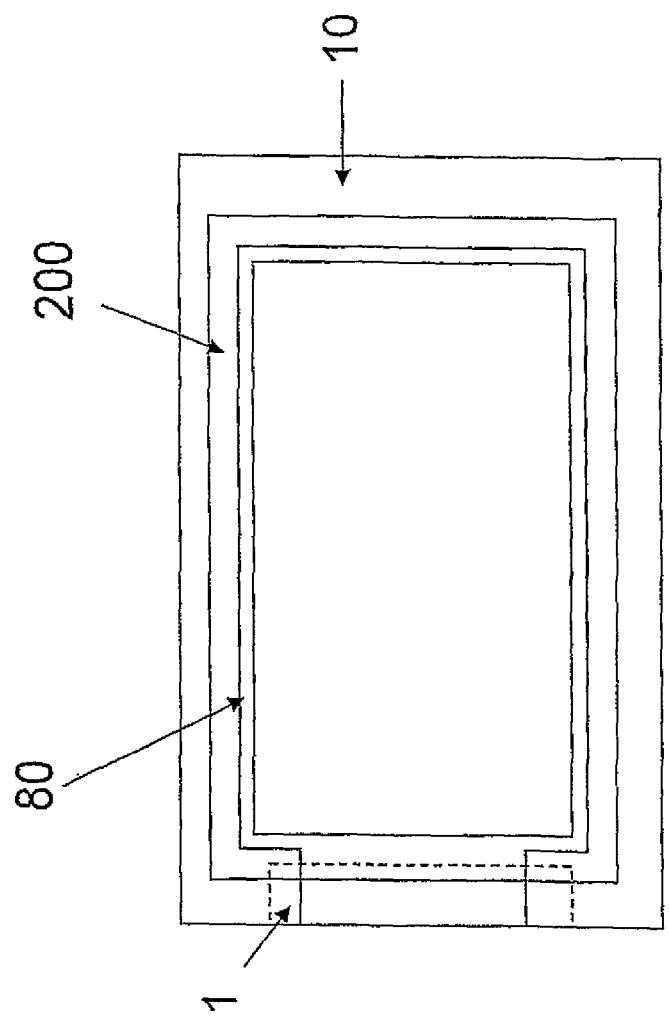
FIG. 7 shows a schematic plan view of an embodiment of the flexible radiation-emitting device.

FIG. 7 shows the plan view of a flexible radiation-emitting device according to one of FIGS. 3 to 6 with a substrate 10, a structured insulating layer 200 and a second electrode 80. The substrate comprises a zone which comprises a gap in the metal film 3 and in which the plastics film 1 is exposed (indicated by dashed line). This zone may serve as insulation between the substrate and layers arranged on the substrate and is an alternative embodiment to insulating layers, which may be applied to the metallic layer in this zone. The other layers such as planarisation layer 2 and organic functional layers 100 are not shown for clarity's sake.

The plan view is intended to make clear the fact that the second electrode 80 protrudes out of the encapsulation 600, which is not shown here, in order to be capable of electrical connection from outside, the insulating layer 200 being present to ensure it does not come into contact with the metal film 3. Additionally or as an alternative, the substrate 10 is constructed in one zone in such a way that no metal film 3 is present which may come into contact with the second electrode, insulation from the substrate thus being provided.

Figure 8:
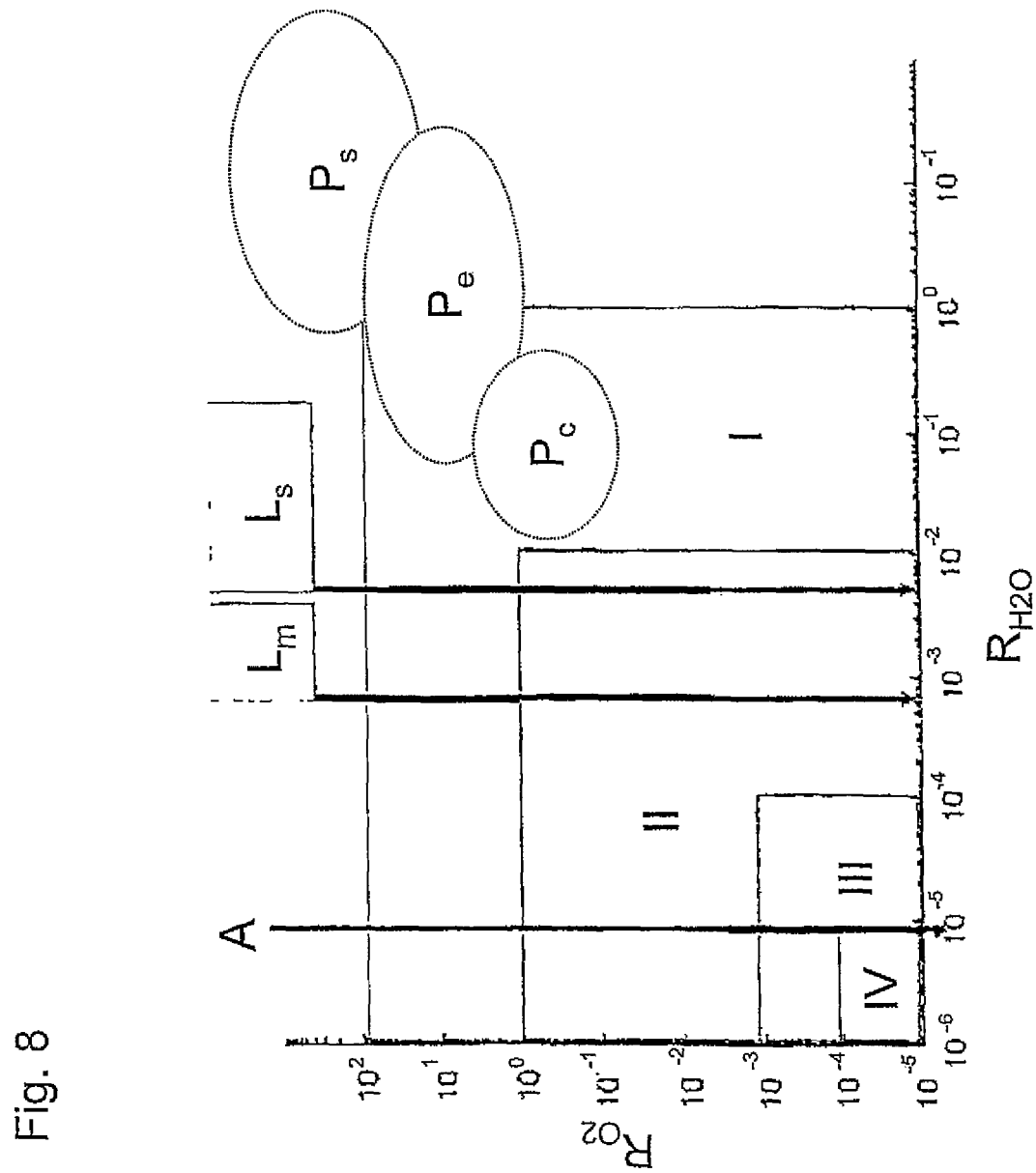
FIG. 8 shows a diagram of the rates of oxygen and water diffusion of different materials.

FIG. 8 shows a diagram of the rate of diffusion of oxygen $R_{O2}$ and water $R_{H2O}$ for various materials. The rate of diffusion of oxygen $R_{O2}$ is plotted on the y axis in $cm^3/m^2 \times d \times bar$, while the rate of diffusion $R_{H2O}$ is plotted on the x axis in $g/m^2 \times d$.

$P_s$ are standard polymers, $P_e$ are specially developed polymers and $P_c$ are coated polymers. In this sequence these polymers display decreasing rates of diffusion for $R_{O2}$ and $R_{H2O}$. Polymers $P_e$ and $P_c$ may for example be used for buttons, in the automotive sector or for electronic utility devices. This range of rates of diffusion is designated range I.

Also indicated are optimised monolayers $L_s$ and multilayer layers $L_m$, which exhibit even lower rates of diffusion, designated range II in the diagram, than the above-stated polymers $P_s$, $P_e$ and $P_c$. These may be used for example for sensors, outdoor electronic devices and white goods.

Range III shows the range of even lower rates of diffusion for $R_{O2}$ and $R_{H2O}$ which is suitable for example for the use of organic liquid crystal diodes or for application in organic photovoltaics. Range IV identifies the rates of diffusion which are suitable for the application of organic light-emitting diodes. A indicates the required value for the rate of diffusion for $R_{H2O}$ which is needed in a material if application in OLEDs is to be possible. This required value is so low that diffusion can no longer be measured with conventional measuring methods. Such a low diffusion value may be achieved by using the flexible substrate comprising a plastics film and a metal film.

The embodiments shown in the Figures and exemplary embodiments may be varied as desired. It should furthermore be borne in mind that the invention is not restricted to the examples, but instead permits further developments which are not listed here.

The invention claimed is:

1. A radiation-emitting device comprising:
   a substrate;
   a single stack of organic functional layer on the substrate; and
   a second electrode on the single stack of organic functional layers,
   wherein the substrate includes a plastics film and a metal film, and the metal film is arranged between the plastics film and the single stack of organic functional layers and is configured as a first electrode, and
   a thin-film encapsulation arranged on the second electrode and on the substrate to encapsulate the at least one organic functional layer,
   wherein the substrate has a larger lateral dimension than the single stack of organic functional layers and the second electrode,
   wherein the metal film as the first electrode and the plastic film are continuous films, which extend underneath of the single stack of organic functional layers and the second electrode and in side view beyond the side edges of the single stack of organic functional layers and the second electrode,
   wherein the thin-film encapsulation is arranged directly onto the second electrode, and
   wherein the thin-film encapsulation is hermetically impermeable to water.

2. The radiation-emitting device according to claim 1, wherein the substrate is free of bather layers.

3. The radiation-emitting device according to claim 1, wherein the substrate is flexible.

4. The radiation-emitting device according to claim 1, wherein the metal film is impermeable to diffusion and the plastics film is less impermeable to diffusion of oxygen and/or moisture and/or water than the metal film.

5. The radiation-emitting device according to claim 1, wherein the metal film comprises at least two sub-layers.

6. The radiation-emitting device according to claim 1, wherein a planarisation layer is arranged between the plastics film and the metal film.

7. The radiation-emitting device according to claim 1, wherein a structured insulating layer is arranged between the glass encapsulation and/or thin-film encapsulation and the substrate.

8. A method of producing a flexible organic radiation-emitting device according to claim 1, comprising the steps of:
    providing a plastics film and a metal film to produce a substrate,
    setting up the metal film (3) as the first electrode, and
    arranging a single stack of organic functional layer and a second electrode on the substrate.

9. The method according to claim 8, wherein method step A) comprises:
    A1) producing a plastics film; and
    A2) arranging a metal film on the plastics film.

10. The method according to claim 9, wherein in method step A2) a material for the metal film is applied to the plastics film by vapour deposition or sputtering.

11. The method according to claim 9, wherein in a method step A3) between method steps A1) and A2) a planarisation layer is arranged on the plastics film.

12. The method according to claim 8, comprising a method step D), following on from method step C), in which the arrangement provided in method step C) is encapsulated by a glass encapsulation and/or thin-film encapsulation.

13. The method according to claim 12, wherein method step D) comprises the steps of:
    D1) arranging a structured insulating layer on zones of the substrate which are not covered by the single stack of organic functional layer; and
    D2) arranging the glass encapsulation and/or thin-film encapsulation (400, 600) over the structured insulating layer and the second electrode.

14. A radiation-emitting device comprising:
    a substrate;
    a single stack of organic functional layer arranged on the substrate;
    a second electrode arranged on the single stack of organic functional layer;
    a glass encapsulation and a thin-film encapsulation arranged on the second electrode and on the substrate to encapsulate the single stack of organic functional layers, wherein the thin-film encapsulation is arranged directly onto the second electrode and the glass encapsulation is arranged over the thin-film encapsulation,
    wherein the substrate includes a plastics film and a metal film, and the metal film is arranged between the plastics film and the single stack of organic functional layers and is configured as a first electrode,
    wherein the substrate has a larger lateral dimension than the single stack of organic functional layer and the second electrode, wherein the metal film comprising the first electrode and the plastic film are continuous films that extend beneath the single stack of organic functional layers and the second electrode and in side view beyond the side edges of the single stack of organic functional layers and the second electrode, and
    wherein the thin-film encapsulation is hermetically impermeable to water.

15. A radiation-emitting device comprising:
    a substrate;
    at least one organic functional layer arranged on the substrate;
    a second electrode arranged on the at least one organic functional layer;
    a glass encapsulation and/or a thin-film encapsulation arranged on the second electrode and on the substrate to encapsulate the at least one organic functional layer; and
    an insulating layer is arranged between the glass encapsulation and/or a thin-film encapsulation and the substrate,
    wherein the substrate includes a plastics film and a metal film, and the metal film is arranged between the plastics film and the at least one organic functional layer and is configured as a first electrode,
    wherein the second electrode is also arranged at least on the insulating layer, and
    wherein the second electrode is arranged at least partially protruding out of the glass encapsulation and/or a thin-film encapsulation and configured to be electrically connected from outside.

* * * * *

UNITED STATES PATENT AND TRADEMARK OFFICE
CERTIFICATE OF CORRECTION

PATENT NO. : 8,772,818 B2
APPLICATION NO. : 13/055901
DATED : July 8, 2014
INVENTOR(S) : Markus Klein Page 1 of 1

It is certified that error appears in the above-identified patent and that said Letters Patent is hereby corrected as shown below:

In the Claims

Column 10, claim 2 should read

2. The radiation-emitting device according to claim 1, wherein the substrate is free of barrier layers.

Signed and Sealed this
Twenty-fifth Day of November, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,772,818 B2 | Page 1 of 1 |
| APPLICATION NO. | : 13/055901 | |
| DATED | : July 8, 2014 | |
| INVENTOR(S) | : Markus Klein | |

It is certified that error appears in the above-identified patent and that said Letters Patent is hereby corrected as shown below:

In the Claims

Column 10, lines 60-61, claim 2 should read

2. The radiation-emitting device according to claim 1, wherein the substrate is free of barrier layers.

This certificate supersedes the Certificate of Correction issued November 25, 2014.

Signed and Sealed this
Twenty-third Day of December, 2014

Michelle K. Lee
*Deputy Director of the United States Patent and Trademark Office*